United States Patent [19]
Neeb

[11] Patent Number: 6,163,161
[45] Date of Patent: Dec. 19, 2000

[54] DIRECTED SELF-HEATING FOR REDUCTION OF SYSTEM TEST TIME

[75] Inventor: James Edward Neeb, Chandler, Ariz.

[73] Assignee: Intel Corporation, Santa Clara, Calif.

[21] Appl. No.: 09/140,626

[22] Filed: Aug. 26, 1998

[51] Int. Cl.[7] .................................................. G01R 31/02
[52] U.S. Cl. ........................................... 324/760; 324/765
[58] Field of Search .............................. 324/73.1, 158.1, 324/765, 760; 257/40, 48; 438/14, 17, 18; 165/80.2, 80.3; 219/209

[56] References Cited

U.S. PATENT DOCUMENTS

| | | | |
|---|---|---|---|
| 3,976,940 | 8/1976 | Chau et al. ............................ | 324/73.1 |
| 5,760,595 | 6/1998 | Edwards et al. ....................... | 324/760 |
| 5,977,785 | 11/1999 | Burward-Hoy ......................... | 324/760 |

*Primary Examiner*—Vinh P. Nguyen
*Attorney, Agent, or Firm*—Raymond J. Werner

[57] ABSTRACT

An integrated circuit provides self-heating in order to assist an externally applied thermal control unit raise the temperature of the integrated circuit to a specified range of temperatures at which functional testing is conducted. In a particular embodiment of the present invention, a packaged integrated circuit that is thermally coupled to a heat dissipating device, including but not limited to a heat sink, is operated in a high power manner prior to functional testing, so as to quickly raise internal junction temperatures to a specified test range before functional testing begins.

16 Claims, 2 Drawing Sheets

DIRECTED SELF-HEATING FOR REDUCTION OF SYSTEM TEST TIME

BACKGROUND OF THE INVENTION

1. Field of the Invention

The invention relates to testing of electronic systems generally, and more particularly to elevated temperature testing of electronic systems.

2. Background

Advances in semiconductor manufacturing technology have led to the reduction of circuit element feature sizes, which in turn has led to the integration of millions of circuit elements, such as transistors, on a single integrated circuit (IC). Not only have interconnect line widths become smaller, but so have the dimensions of metal-oxide-semiconductor field effect transistors (MOSFETs). MOSFETs are also commonly referred to simply as FETs.

Reduction of circuit feature sizes will reduce the associated parasitic capacitance that results in unwanted power dissipation during the operation of the integrated circuit. However, the trend to increase the number of active circuit elements and the frequency at which those circuit elements operate has resulted in integrated circuits that consume relatively large amounts of power as compared to earlier generations of integrated circuits.

A well known effect of high power consumption in integrated circuits is the elevation of operating temperature. That is, as more power is consumed, the temperature of the integrated circuit rises. As a direct result of the increase in the temperature of the integrated circuit, various temperature dependent operational characteristics of transistors within the integrated circuit will change such that the overall effect is a reduced ability to operate at high frequency. Put more simply, as the temperature rises the integrated circuit tends to slow down.

In order to preserve the desired high speed operational characteristics for integrated circuits with relatively high power consumption, various power management and thermal management strategies have been adopted. One example of a power management technique is reducing the frequency of operations when the need for high speed operation is absent. In this way power consumption is reduced. One example of a thermal management technique is providing a thermally conductive pathway, such as a heatsink, with which to draw waste heat away from the integrated circuit. Indeed, heat sinks have become ubiquitous as a simple, cost effective mechanism for removing waste heat. Together, power management and thermal management techniques work to maintain the integrated circuit at a temperature low enough to achieve the desired high speed operation.

Before an integrated circuit reaches a customer, the integrated circuit manufacturer conducts a series a tests to verify that the integrated circuit operates according to some specification. A complex integrated circuit, such as a microprocessor, is typically tested first while it is still in wafer form, and then tested again after it is packaged. The testing of integrated circuits at the wafer level and packaged level is typically performed with a general purpose programmable tester. More recently, a requirement has arisen for these complex integrated circuits to be tested yet again in a system environment that closely emulates the environment in which these integrated circuits will actually be used. It is well-known in the field of integrated circuit testing that parameters such as the power supply voltage and the temperature of the integrated circuit must be controlled to achieve an appropriate confidence level in the test results. It is also well-known in the field of integrated circuit testing that increasing the time involved in testing an integrated circuit increases the costs of manufacturing.

What is needed are methods and systems for effectively testing complex integrated circuits in a system environment without consuming unnecessary amounts of time.

SUMMARY OF THE INVENTION

Briefly, an integrated circuit provides self-heating in order to assist an externally applied thermal control unit raise the temperature of the integrated circuit to a specified range of temperatures at which functional testing is conducted.

In a particular embodiment of the present invention, a packaged integrated circuit that is thermally coupled to a heat dissipating device, such as but not limited to a heat sink, operates so as to quickly raise internal junction temperatures to a specified test range before functional testing begins.

DETAILED DESCRIPTION

Overview

Illustrative embodiments of the present invention are described below. In the interest of clarity, not all aspects of an actual implementation are described in this specification. It will of course be appreciated that in the development of any such actual embodiment, numerous implementation-specific decisions must be made to achieve the developer's specific goals, such as compliance with system-related, and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Terminology

The terms, chip, integrated circuit, monolithic device, semiconductor device, and microelectronic device, are often used interchangeably in this field. The present invention is applicable to all the above as they are generally understood in the field.

The acronym DUT refers to a Device Under Test. A DUT as used herein is typically an integrated circuit that is operated so that a determination can be made as to whether the DUT performs according to various parametric and functional specifications.

The expression thermal management device refers to the various apparatus that can be used to remove heat from an integrated circuit. Heat sinks and heat pipes are examples of thermal management devices.

Illustrative System

Figure 1:
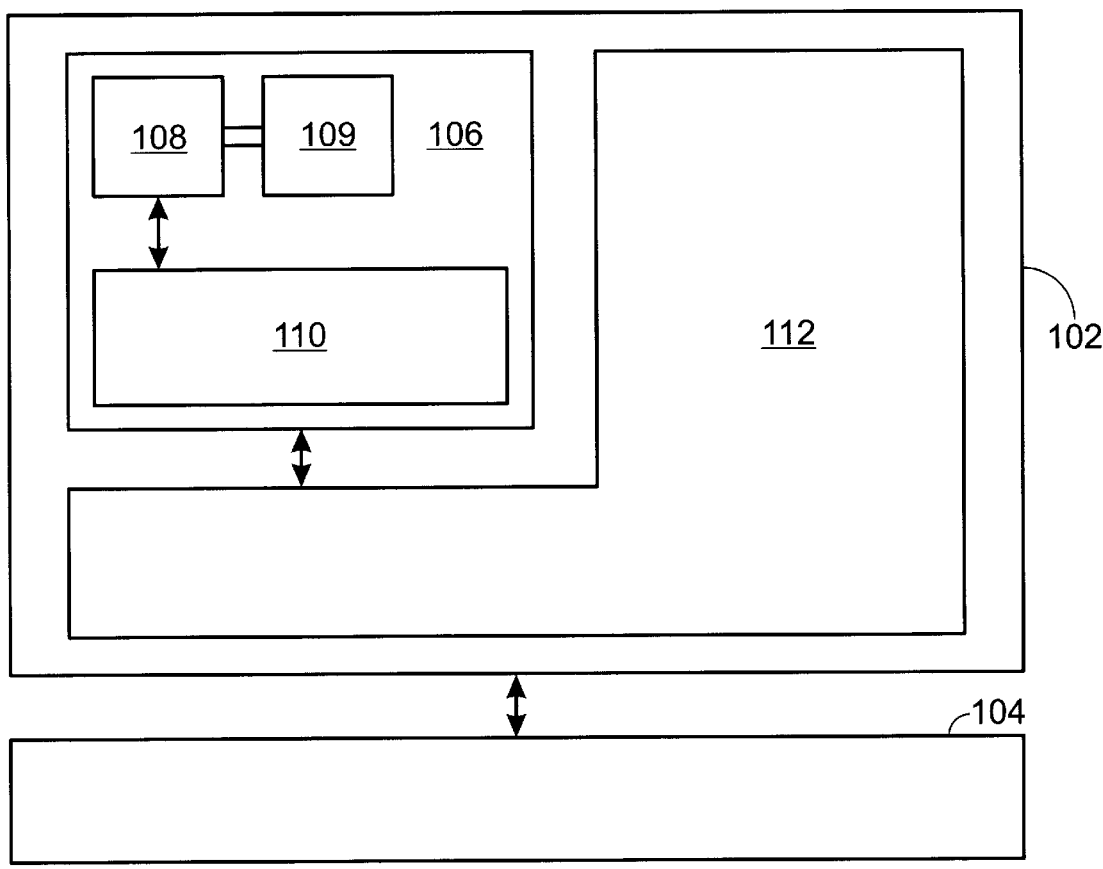
FIG. 1 is a block diagram of a system test environment in accordance with the present invention.

An exemplary system test environment for microprocessor based systems is shown in FIG. 1. Those skilled in the art will recognize that the invention is not limited to the context of microprocessors, but rather is applicable to any type of integrated circuit requiring a systems level test and having a thermal mass sufficiently large that the DUT can not be quickly and easily heated to its test temperature via external heating devices alone.

Still referring to FIG. 1, there is shown a systems level tester 100, alternatively referred to as a systems test environment. In the illustrative embodiment, tester 100 includes a test head 102, and a test rack 104 coupled to test head 102. Test head 102 provides the system environment for the DUT. More particularly, in the illustrative embodiment test head 102, includes a mother board 106, and test head electronics 112. Mother board 106, includes a DUT socket 108 coupled to mother board electronics 110. Mother board electronics 110 include various interface and control circuits that are well known in the microprocessor arts. For example, logic circuits for controlling system memory and peripheral buses may be included in mother board electronics 110. DUT socket 108 is adapted to receive an integrated circuit such as a microprocessor in the illustrative embodiment.

Tester 100 further includes a thermal head 109 coupled to test rack 104, and adapted for coupling to a DUT inserted into DUT socket 108. In a typical system test environment for integrated circuits, thermal head 109 often includes a peltier heating/cooling head that is in contact with the device under test (DUT).

Test rack 104 generally includes power supply and control circuitry for powering and controlling the operation of the DUT by test head 102.

Illustrative Method

Tests that are not temperature critical are executed first in the test flow. These tests are executed as the thermal head is bringing the device temperature up to the specified temperature range. Generally, these non-temperature-critical tests do little to help elevate the device temperature. However, once the device under test has been verified to not have any power shorts, it is typically fully powered up and a high power dummy test is run to assist the thermal head in heating up the device.

The expression "high power dummy test" refers to operating a DUT in a manner wherein the DUT's power consumption is at or near the high end of the power consumption expected during operation in a system environment. Although this operation takes place within a tester environment, the performance of the DUT, as measured by the output signals generated by the DUT, is typically not evaluated. That is, the tester ignores the DUT output signals during the high power dummy test. Those skilled in the art and having the benefit of this disclosure will recognize that ignoring the output signals generated by the DUT is not a requirement of the present invention. However, as the timing characteristics of these generated signals will typically change as the DUT is heated to the desired range of temperature for testing, it is simply more practical to wait until the DUT has reached the test temperature range before evaluating the output signals.

Typically, the dummy test is halted when the proper range of device temperature is reached. Halting the dummy test may be done as a function of a temperature that is actually measured, or as a function of time. In order to successfully use a timed duration dummy test, the heating characteristics of the device must be predetermined to establish the length of time needed to reach the proper range of device temperature.

In the illustrative embodiment of the present invention, the device under test is heated to a range of approximately 65° C. to 100° C.

Heating an integrated circuit with a high power dummy test in addition to an external heating device (e.g., a thermal head) can substantially reduce the time needed to bring the device under test to the desired temperature range for testing. Such an approach is particularly advantageous in the case where the device under test has a large thermal mass. Large, complex, integrated circuits intended for operation at high frequency, including but not limited to microprocessors, are often packaged in such a way as to include a thermal management device, which effectively gives the integrated circuit a large thermal mass.

Typically, a normal test flow is begun after the device under test has reached the proper range of device temperature.

Figure 2:
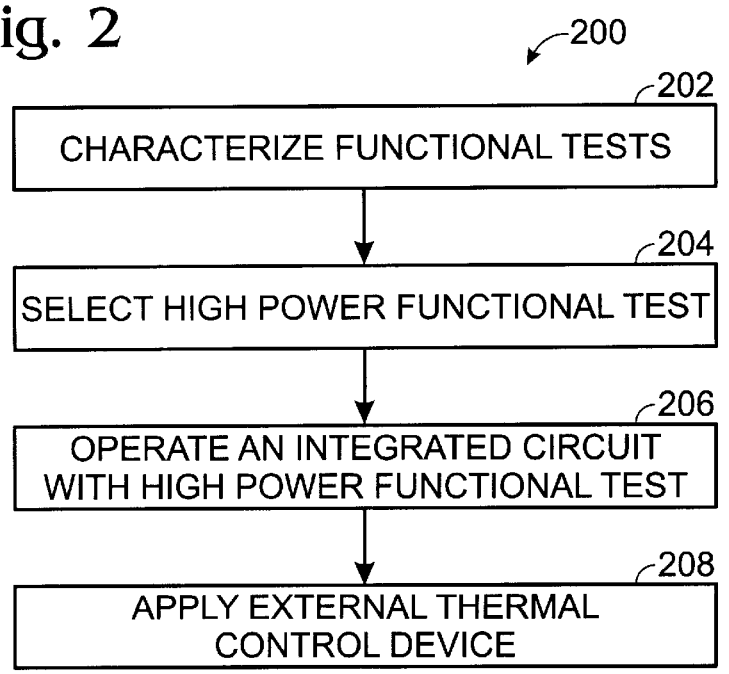
FIG. 2 is a flowchart illustrating a method, in accordance with the present invention, of preparing an integrated circuit for testing.

FIG. 2 shows a flowchart of a process 200 that prepares an IC for testing. As shown at block 202, functional tests are characterized.

Generally, in a system test environment an integrated circuit that is to be tested (i.e., a DUT) is operated in a manner that is very similar or identical to the manner in which the integrated circuit will be operated in an actual end user system. In the case where the DUT is a microprocessor, the system test environment creates the signals, data, voltages, timing conditions, and loading that resemble those encountered by the DUT in an end user system. An example of such an end user system includes but is not limited to, a personal computer. Typically signals supplied to a DUT are electrical signals, however these signals may take the form of mechanical or optical signals. For example, microelectronic devices that include accelerometers may require a systems environment that provides spatial translation, while some other microelectronic devices accept optical signals for clocks or data.

In an exemplary embodiment of the present invention, wherein the DUT is a microprocessor and the system test environment emulates a personal computer, the tester provides various "test patterns" to the DUT that cause the DUT to perform corresponding various operations. These test patterns consist of signals representing, among other things, instructions and data. An integrated circuit often consumes more or less power depending upon the functional operation that it is performing. Because it is desirable to generate heat quickly to raise the DUT operating temperature into the desired temperature range for testing, it is preferable to select a test pattern that causes the DUT to consume more rather than less power. The process of characterizing various test patterns includes operating the DUT in accordance with the test patterns and measuring the time taken to heat the device from a known temperature, typically room temperature, to the desired range of test temperatures. Alternatively, the power consumption can be determined by monitoring the current drawn over time and the voltage at which that current was drawn by the DUT. As will be understood by those skilled in the art, a determination of the heating caused by the power consumption of the DUT can then be made.

Once the various test patterns have been characterized to determine which provides the shortest heating time, typically, one test pattern is selected 204 to become the high power dummy test. As discussed above, these tests, or test patterns, are used to functionally exercise the DUT, and so the operation of the DUT under the influence of these test patterns may be described as a functional test, or a functional operation. Although a pattern that results in the shortest heating time is generally preferable, there are alternatives in the selection process. For example, those skilled in the art will appreciate that it may be advantageous to select a functional operation that does not provide the fastest heating, but that provides reasonable heating time while further providing certain electrical conditioning for the system test environment that results in an overall reduction in test time or a faster detection of flaws.

As shown in FIG. 2 at block 206, the DUT is operated in accordance with the functional test selected at 204, so that the DUT functions in a way that quickly heats the DUT.

Again referring to FIG. 2, an external heat source is applied 208 to the DUT. The external heating and self-heating together raise the temperature of the DUT to the desired temperature range for testing.

Figure 3:
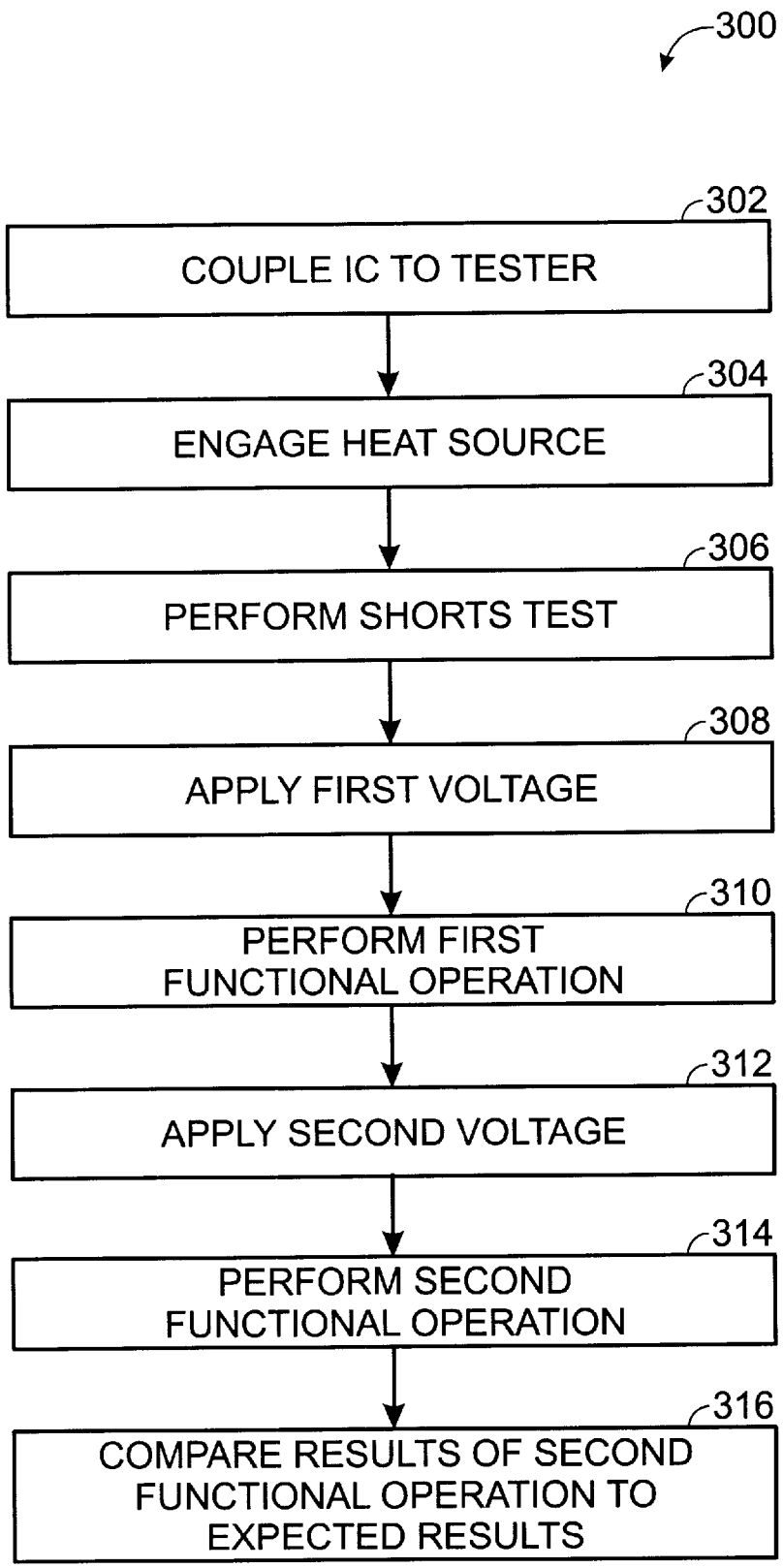
FIG. 3 is a flowchart illustrating a method, in accordance with the present invention, for testing an integrated circuit.

FIG. 3 shows a flowchart of process 300 that tests an IC. As shown at block 302, an IC is coupled to a tester. Coupling an IC to a tester typically involves inserting the IC into a socket that is connected to the system tester. Those skilled in the art will recognize that an IC may be coupled to the tester in other ways, such as, for example, a cable that connects the IC to the tester.

A heat source is then engaged with the IC as shown at 304. Typically the heat source is a thermal control head such as a peltier heating/cooling head, and it is engaged such that heat transfer between the thermal control head and the IC is enabled. The thermal control head is then operated to raise the temperature of the IC to the desired temperature range for testing. Tests that are not temperature critical are performed while the IC is heating. For example, a shorts test can be performed 306 to determine whether shorts exist between any power and ground nodes. After a shorts test is performed the IC is "powered up". That is, voltage is applied 308 to various power and ground terminals of the IC. Typically, the voltage applied at 308 is greater than the nominal power supply voltage specified for the particular IC that is being tested. In this way the IC will tend to self-heat more rapidly.

A first functional operation is then performed 310. If the DUT is a microprocessor, then the first functional operation may be, but is not limited to, executing a set of instructions that comprises booting an operating system. Those skilled in the art and having the benefit of this disclosure will recognize that any other set of instructions may be executed by the microprocessor, and that the present invention is not limited to the particular functionality chosen for the first functional operation.

Once the IC has reached the desired range of temperature for testing, the power supply voltages are adjusted 312, typically to be less than the nominal power supply voltage. Low voltage and high temperature generally create the worst case conditions for an integrated circuit in terms of high frequency operation. It is preferable that the first functional operation be such that the DUT consumes power at or near the high end of the power consumption expected in a system environment.

A second functional operation is then performed 314. The results of the second functional operation are compared to expected results 316. The second functional operation may be the same as, or different from the first functional operation.

If the observed results of the second functional operation match the expected results, then the DUT has passed the test. If the results do not match the DUT has failed the test. By operating the DUT in a high temperature, low voltage condition, the manufacturer is able to ascertain whether the DUT has sufficient performance margin to be accepted for shipment to a customer.

Conclusion

The present invention provides for reduced system test time by raising the temperature of a DUT having a large thermal mass through the application of both an external heating mechanism and by operating the device under test so as to intentionally generate a substantial amount of internal heating.

An advantage of the present invention is that a manufacturing costs are reduced.

It will be understood by those skilled in the art and having the benefit of this disclosure that the present invention can be practiced with integrated circuits without regard to the particular functionality of that integrated circuit. For example, core logic devices, graphics chips, and digital signal processors may all benefit from the present invention. Similarly, it will be understood that test patterns may be generated through the use of a stored program executed by a computer in conjunction with well-known hardware elements, or the test patterns may be completely generated by hardware, or combinations of hardware and software based test pattern generation may be used.

It will be understood that various other changes in the details, materials, and arrangements of the parts and steps which have been described and illustrated in order to explain the nature of this invention may be made by those skilled in the art and having the benefit of this disclosure without departing from the principles and scope of the invention as expressed in the subjoined Claims.

What is claimed is:

1. A method of testing an integrated circuit, comprising:
   coupling an IC having power supply terminals to a tester;
   engaging a thermal control head with the IC;
   performing a shorts test;
   applying a first voltage to the power supply terminals of the IC;
   performing a first functional operation such that a temperature of the IC is increased by self-heating during the first functional operation;
   applying a second voltage to the power supply terminals of the IC; and
   performing a second functional operation;
   wherein the first voltage is chosen so as to provide greater self-heating than the second voltage.

2. The method of claim 1, wherein the second voltage is less than the first voltage.

3. The method of claim 1, wherein the IC has a plurality of output terminals coupled to a tester; the IC generates a plurality output signals at the plurality of output terminals during the first functional operation, and at least a portion of the output signals are ignored by the tester during the first functional operation.

4. The method of claim 1, wherein the IC has a plurality of output terminals coupled to a tester; the IC generates a plurality output signals at the plurality of output terminals during the first functional operation, and the output signals are ignored by the tester during the first functional.

5. The method of claim 1, wherein the first functional operation is repeated until the IC has reached a predetermined range of temperatures.

6. The method of claim 1, further comprising heating the IC with the thermal control head.

7. The method of claim 1, further comprising rejecting the IC if shorts are detected.

8. The method of claim 1, further comprising rejecting the IC if the output signals at the output terminals of the IC do not match the expected output signals.

9. The method of claim 1, further comprising:
   heating the IC with the thermal control head; and
   rejecting the IC if shorts are detected;
   wherein the second voltage is less than the first voltage; the IC has a plurality of output terminals coupled to a tester; the IC generates a plurality output signals at the plurality of output terminals during the first functional operation, and at least a portion of the output signals are ignored by the tester during the first functional operation; and the first functional operation is repeated until the IC has reached a predetermined range of temperatures.

10. The method of claim 9, wherein rejecting the IC includes stopping the heating of the IC with the thermal control head.

11. The method of claim 1, wherein coupling an IC to a tester comprises inserting the IC into a socket.

12. A method of testing an integrated circuit, comprising:
   inserting an IC into a socket, the IC having power supply terminals, input terminals, output terminals, input/output terminals, and a heat removal device;
   heating the IC with a thermal control head;
   performing a shorts test;
   applying a voltage that is higher than the nominal power supply voltage to the power supply terminals of the IC;
   repeatedly executing a first functional operation for a predetermined period of time such that a temperature of the IC is increased by self-heating during the execution of first functional operation;
   applying a voltage that is lower than the nominal power supply voltage to the power supply terminals of the IC;
   executing a second functional operation; and
   comparing a plurality of signals at the output terminals to an expected result.

13. The method of claim 12, wherein the first functional operation and the second functional operation are the same.

14. The method of claim 12, wherein the first functional operation comprises booting an operating system.

15. The method of claim 12, wherein the second functional operation comprises booting an operating system.

16. The method of claim 12, wherein the first functional operation is characterized by high power consumption.

* * * * *